(12) United States Patent
Flaim

(10) Patent No.: US 10,617,010 B2
(45) Date of Patent: Apr. 7, 2020

(54) POLYMER FILM STENCIL PROCESS FOR FAN-OUT WAFER-LEVEL PACKAGING OF SEMICONDUCTOR DEVICES

(71) Applicant: Brewer Science Inc., Rolla, MO (US)

(72) Inventor: Tony D. Flaim, St. James, MO (US)

(73) Assignee: Brewer Science, Inc., Rolla, MO (US)

( * ) Notice: Subject to any disclaimer, the term of this patent is extended or adjusted under 35 U.S.C. 154(b) by 0 days.

(21) Appl. No.: 15/689,056

(22) Filed: Aug. 29, 2017

(65) Prior Publication Data

US 2018/0063963 A1 Mar. 1, 2018

Related U.S. Application Data

(60) Provisional application No. 62/380,762, filed on Aug. 29, 2016.

(51) Int. Cl.
*H01L 23/02* (2006.01)
*H05K 3/12* (2006.01)
*H05K 1/18* (2006.01)
*H05K 1/02* (2006.01)
*H05K 1/03* (2006.01)
*H01L 23/13* (2006.01)
*H01L 23/538* (2006.01)

(52) U.S. Cl.
CPC ........... *H05K 3/1216* (2013.01); *H01L 23/13* (2013.01); *H01L 23/5383* (2013.01); *H01L 23/5384* (2013.01); *H01L 23/5389* (2013.01); *H05K 1/0236* (2013.01); *H05K 1/0373* (2013.01); *H05K 1/187* (2013.01)

(58) Field of Classification Search
CPC .. H01L 23/13; H01L 23/5383; H01L 23/5384
See application file for complete search history.

(56) References Cited

U.S. PATENT DOCUMENTS

| | | | |
|---|---|---|---|
| 9,496,164 B2 | 11/2016 | Bai et al. | |
| 9,827,740 B2 | 11/2017 | Liu et al. | |
| 2008/0315375 A1* | 12/2008 | Eichelberger | H01L 21/6835 257/659 |
| 2013/0301228 A1* | 11/2013 | Tao | H01L 21/561 361/748 |

(Continued)

OTHER PUBLICATIONS

Lau, John, "Are Glass Substrates the Next Option for Fan-out Packaging?" May 16, 2017, 3DInCites, www.3dincites.com.

(Continued)

*Primary Examiner* — Samuel A Gebremariam
(74) *Attorney, Agent, or Firm* — Hovey Williams LLP

(57) ABSTRACT

The present invention provides stencil-based processes for fan-out wafer-level packaging ("FOWLP") that addresses the limitations associated with prior art over-molding of dies. In the inventive process, a temporary carrier is coated with a release layer and curable adhesive backing layer. A die stencil film is then laminated to the coated carrier, and the dies are placed inside pre-formed cavities created in the laminated stencil. The gaps between the dies and the stencil are filled with a curable polymeric material, and a redistribution layer is constructed according to conventional processes. This process results in better repeatability, lower bowing in the carrier, and enhanced downstream processing.

23 Claims, 4 Drawing Sheets

(56) References Cited

U.S. PATENT DOCUMENTS

2014/0321087 A1* 10/2014 Zhang .................... H05K 3/244
                                                              361/767
2015/0064385 A1   3/2015 Flaim et al.
2017/0263837 A1*  9/2017 Jeon .................. H01L 21/67144

OTHER PUBLICATIONS

Garrou, Phil, "Insights from Leading Edge: IFTLE 333 Amkor & Global discuss FOWLP at IMAPS Device Pkging Conf," 2017, http://electroiq.com/insights-from-leading-edge/2017/05/iftle-333-amkor-global-discuss-fowlp-at-imaps-device-pkging-conf/.

* cited by examiner

POLYMER FILM STENCIL PROCESS FOR FAN-OUT WAFER-LEVEL PACKAGING OF SEMICONDUCTOR DEVICES

RELATED APPLICATION

The present application claims the priority benefit of U.S. Provisional Patent Application Ser. No. 62/380,762, filed Aug. 29, 2016, entitled POLYMER FILM STENCIL PROCESS FOR FAN-OUT WAFER-LEVEL PACKAGING OF SEMICONDUCTOR DEVICES, incorporated by reference in its entirety herein.

BACKGROUND OF THE INVENTION

Field of the Invention

The present invention is broadly concerned with fan-out wafer-level packaging processes, and particularly an improvement to that process, where the improvement adds a stencil process.

Description of the Prior Art

Fan-out wafer-level packaging ("FOWLP") has recently emerged as a new die and wafer level packaging process. A typical FOWLP process is depicted in FIG. 1. A carrier 10 having an upper surface 12 is provided. A tape adhesive layer 14 is applied to upper surface 12 of carrier 10 (FIG. 1(a)). Layer 14 has an upper surface 16, and a plurality of semiconductor dies 18 are positioned on the upper surface 16 of layer 14, as shown in FIG. 1(b).

Referring to FIG. 1(c), an epoxy molding compound ("EMC") is applied to form an EMC layer 20 over the dies 18, with the EMC layer 20 having a lower surface 22 that is in contact with upper surface 16 of tape layer 14. The EMC is leveled and cured. (This EMC over-molding occurs at wafer-level or panel-level, while the individual packages are still joined together as an array.) Next, the bond between upper surface 16 of tape layer 14 and the dies 18 and lower surface 22 of the EMC layer 20 is disrupted so that the carrier 10 and tape layer 14 are separated from the EMC layer 20 and dies 18, leaving epoxy-embedded die structure 24. Structure 24 can then be subjected to further processing, such as passivation, patterning, redistribution layer ("RDL") formation, singulation, electroplating, plasma etching, cleaning, chemical vapor deposition, physical vapor deposition, and combinations of the foregoing. FOWLP allows for increased numbers of input/output ("I/O") connection points over conventional wafer level packaging processes by using the space between each die for additional I/O connection points.

While FOWLP is a significant advancement, the process invariably requires a step in which the semiconductor dies are over-molded with the EMC, effectively embedding the dies in a monolithic structure that provides much of the structural strength to the final package. However, the over-molding process and reliance on an over-molded structure to stabilize the package leads to serious fabrication problems as well as long-term reliability issues when the package is attached to the printed circuit board. Some of the commonly-encountered issues include the following:

The over-molding process is time-consuming and must be performed at high temperatures and pressures, which places high stresses on the dies and any interconnections that have already been formed between the dies and the input and output contacts for the package.

EMC materials suffer from notoriously poor batch-to-batch consistency. As a result, manufacturers frequently have to adjust their processing conditions to achieve satisfactory molding results.

EMC materials create additional stress within the package when they are cured. This stress often results in severe warping and bowing of the wafer- or panel-level assembly, making it difficult to handle in automated processing equipment. This same stress can cause bowing of the individual packages. Consequently, when the package is bonded to the printed circuit board, some of the distributed contacts on the package surface may not connect to the board or may weaken and break over time.

SUMMARY OF THE INVENTION

The present invention overcomes the problems of the prior art by providing a new fan-out wafer level package process. The process comprises applying a stencil layer to a carrier stack. The stencil layer has openings formed therein, and the carrier stack comprises:
  a carrier having an upper surface;
  optionally a release layer adjacent the upper surface of the carrier, the release layer having an upper surface remote from the carrier; and
  a bonding layer adjacent the upper surface of the release layer, if present, or adjacent the upper surface of the carrier if no release layer is present, the bonding layer having an upper surface remote from the carrier and the stencil layer being adjacent the bonding layer upper surface.

The dies are placed in respective openings, with the dies having respective lower surfaces adjacent the carrier stack and having respective upper surfaces remote from the carrier stack.

In another embodiment, a fan-out wafer level package structure is provided. The structure comprises:
  a carrier having an upper surface;
  optionally a release layer adjacent the upper surface of the carrier, the release layer having an upper surface remote from the carrier;
  a bonding layer adjacent the upper surface of the release layer, if present, or adjacent the upper surface of the carrier if no release layer is present, the bonding layer having an upper surface remote from the carrier;
  a stencil layer having openings formed therein and being adjacent the bonding layer upper surface; and
  dies in respective openings.

In yet a further embodiment, the invention provides a fan-out wafer level package structure comprising a plurality of dies embedded in a polymeric layer. The dies have respective sidewalls, and there is a layer of material between the sidewalls and the polymeric layer that is chemically different from the material of which the polymeric layer is formed.

Finally, the invention is also directed towards a fan-out wafer level package structure comprising a plurality of dies having upper and lower surfaces and being embedded in a non-epoxy polymeric layer. The dies have a redistribution layer adjacent at least one of the upper and lower surfaces.

DETAILED DESCRIPTION OF THE PREFERRED EMBODIMENTS

Figure 2:
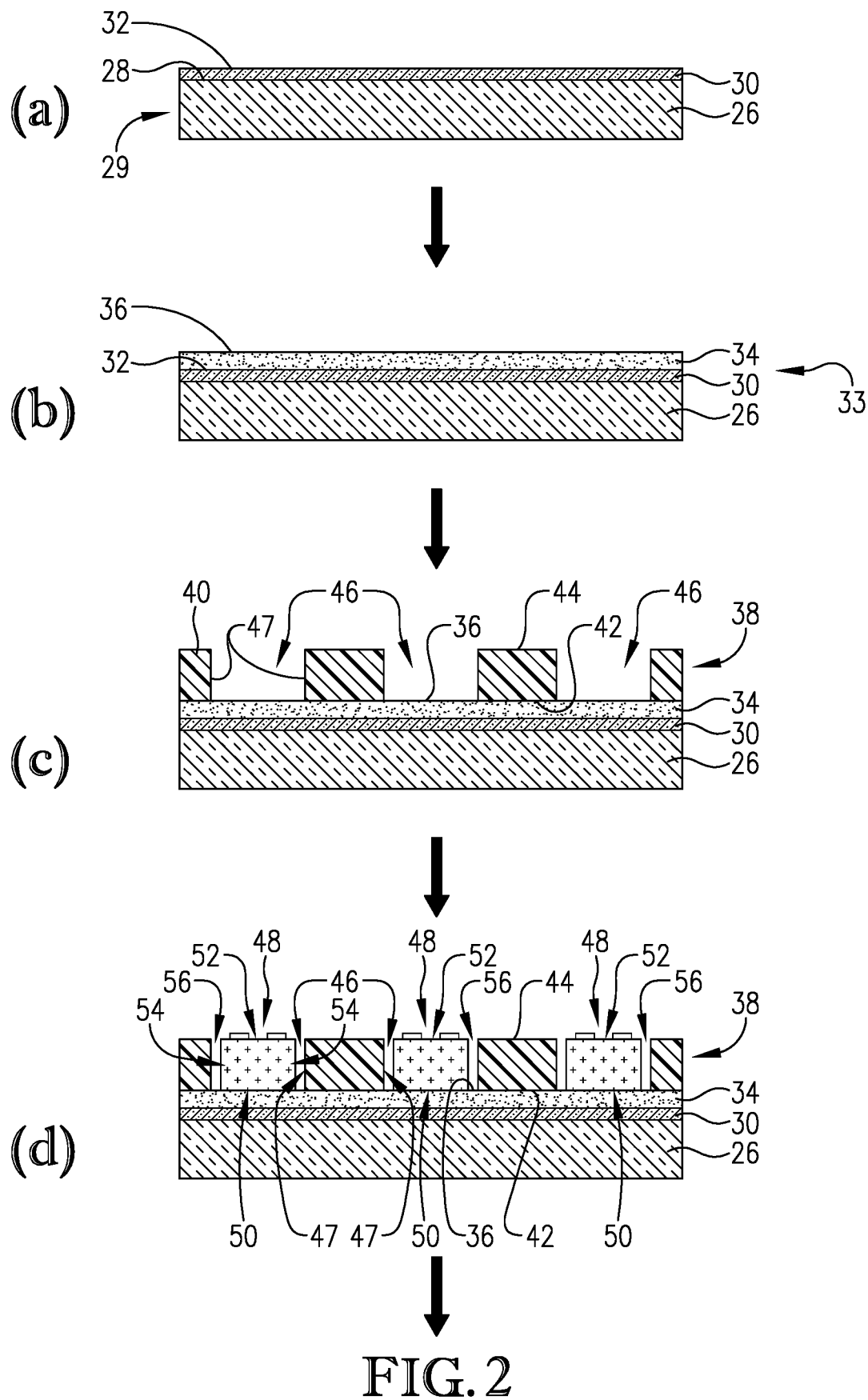
FIG. 2 is a cross-sectional view of a schematic drawing showing the inventive FOWLP process.
Figure 2:
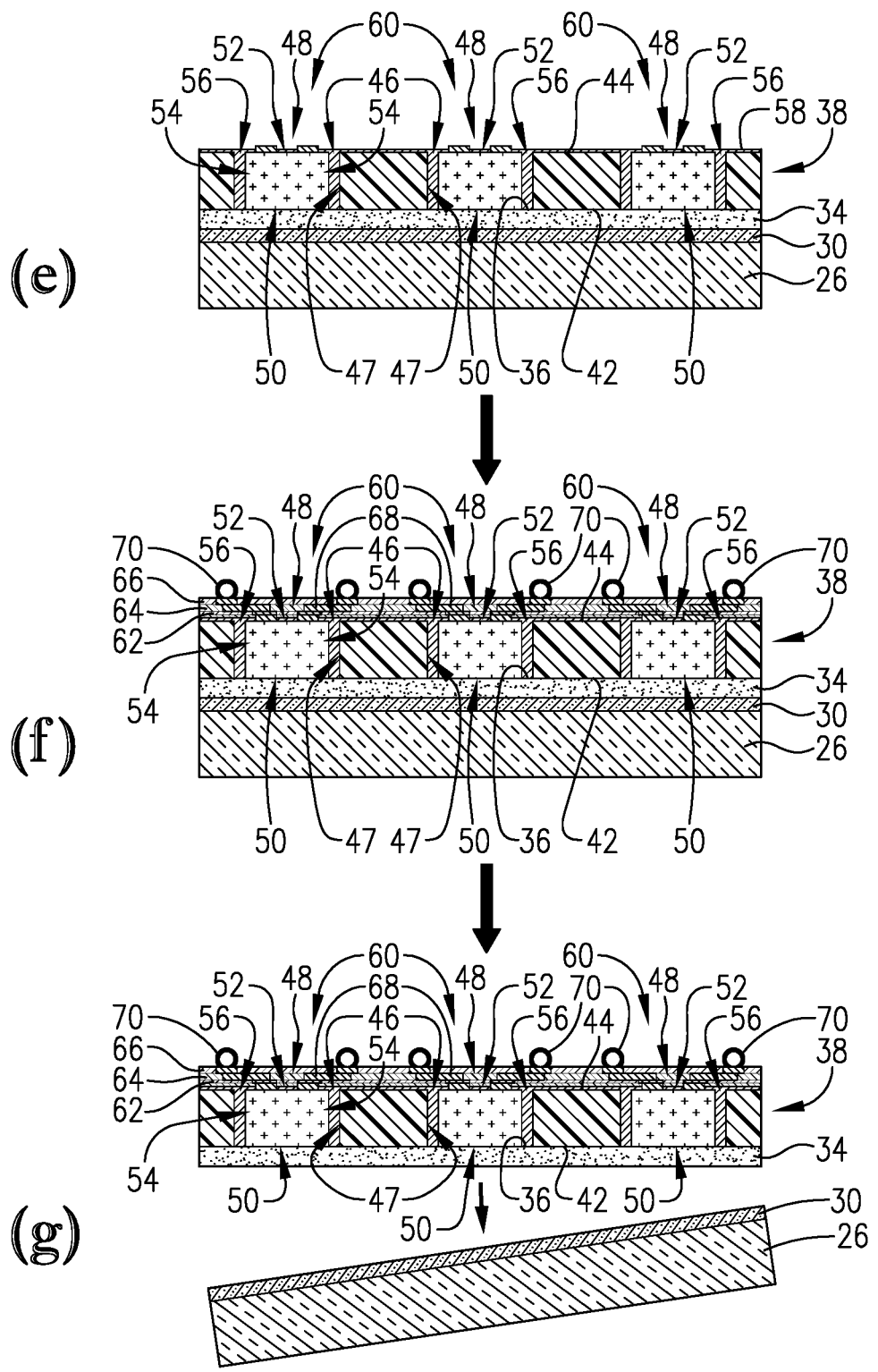

The inventive FOWLP process is depicted in FIG. 2. Referring to FIG. 2(a), a temporary carrier 26 having a front or upper surface 28 is provided as part of a carrier stack 29. Preferably, the temporary carrier 26 is the same size and shape as a standard semiconductor wafer or panel. This allows the temporary carrier 26 to be processed using standard semiconductor processing equipment. Suitable materials for forming carrier 26 include those selected from the group consisting of silicon, glass, and various metals and ceramics. Glass is usually preferred for panel-level construction, while silicon is usually preferred for wafer-level construction.

Next, a release layer 30 having its own upper (relative to the carrier 26) surface 32 is preferably formed adjacent or on the front surface 28 of the temporary carrier 26 to form a modified carrier stack 33. Suitable release layer materials include polymeric compositions that provide a means for removing the package assembly from the carrier without damage. The release layer 30 may be applied by typical methods, including those selected from the group consisting of spin coating, lamination, slot-die coating, and printing. The release layer 30 allows for any separation means, including mechanical separating (peeling) or decomposing in response to laser irradiation through a transparent carrier 26. The release layer 30 should provide sufficient adhesion through subsequent processing without decomposing or otherwise having its functionality altered when exposed to the various chemicals, conditions, and processes involved in forming the final package. Some preferred release layers are described in U.S. patent application Ser. Nos. 14/472,073 and 14/805,898, as well as in U.S. Pat. No. 9,496,164, each of which is incorporated by reference herein.

While it is preferred that a release layer 30 is utilized, it will be appreciated that in some embodiments (not shown) such a release layer 30 is optional.

Referring to FIG. 2(b), a curable adhesive backing or bonding layer 34 having an upper (relative to the carrier 26) surface 36 is then formed adjacent or on upper surface 32 of the release layer 30. The curable bonding layer 34 is preferably a polymeric composition that cures in response to heating or by exposure to ultraviolet light. If the material used to form bonding layer 34 is designed to undergo thermal curing, then it should not harden or lose its tack at temperatures required for attaching the polymer film stencil. That is, the bonding layer 34 should not harden or lose its tack at temperatures of less than about 150° C., and preferably doesn't do so at temperatures of less than about 100° C. Additionally, the bonding layer 34 should have enough tack in the uncured state that a die stencil (discussed below) can be laminated to it at temperatures and pressures normally accessible by commercial film lamination equipment, which is preferably at temperatures less than about 150° C. The bonding layer 34 may be applied by any conventional means including those selected from the group consisting of spin coating, lamination, slot die coating, and screen printing.

Figure 3:
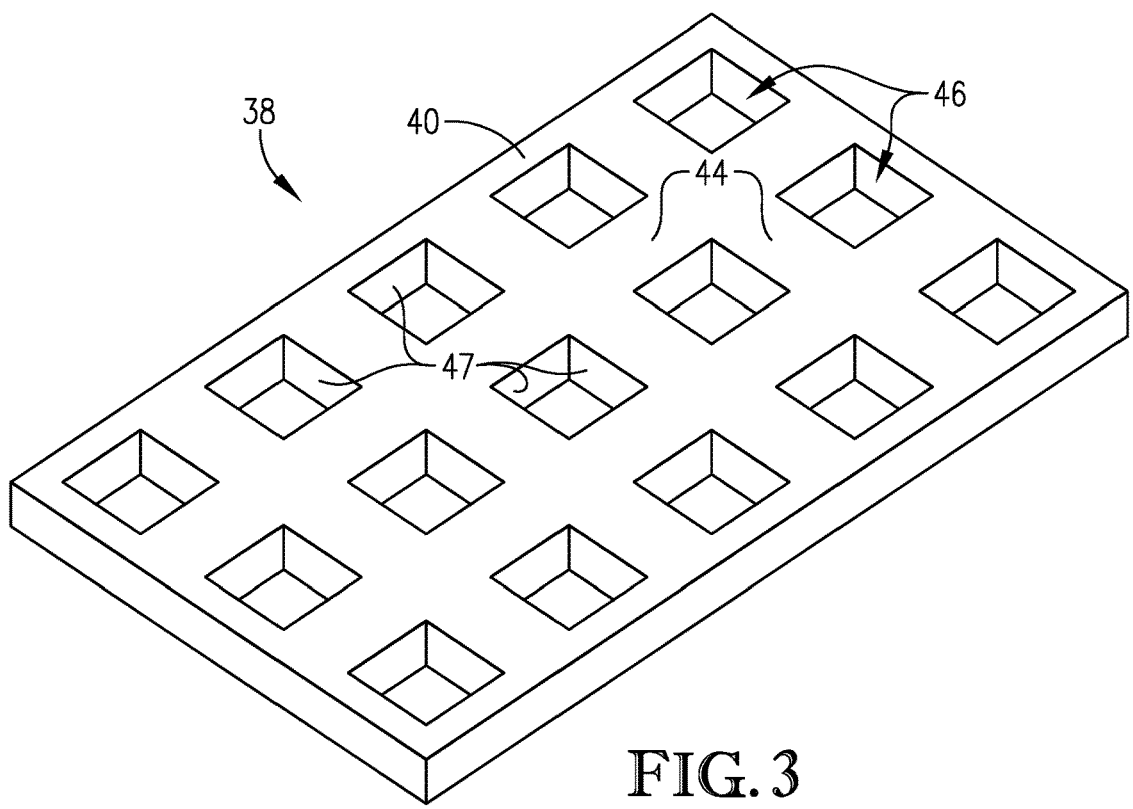
FIG. 3 is an illustration of an inventive stencil that can be used in an FOWLP process.

A stencil layer 38 is formed or applied adjacent to or on the curable adhesive backing or bonding layer 34 (FIG. 2(c)). Referring to FIG. 3, a schematic representation of a possible design of stencil 38 is shown. It will be appreciated that this is a cross-sectional view of an exemplary stencil 38 as typically the overall size and shape of the stencil 38 would correspond to the size and shape of a standard semiconductor wafer or panel. That being said, it is contemplated that in some instances, one may wish to use a smaller and/or differently-shaped stencil 38, or even multiple stencils on the same wafer or panel.

As shown in FIG. 3, the stencil 38 has a body 40 comprising a first surface 42, a second surface 44, and a plurality of repeating openings or holes 46 formed therein. Each opening 46 is defined by respective sidewalls 47. The openings 46 pass entirely through the stencil body 40, from first surface 42 to second surface 44, and correspond to the size and shape (square-shaped, in this instance) of the dies that will ultimately be placed on the carrier substrate.

The stencil 38 is preferably in the form of a polymer film having very high temperature stability. That is, the chosen material is preferably polymeric in nature and preferably does not melt or thermally decompose below about 200° C., more preferably not below about 300° C., and even more preferably not below about 400° C. as determined by ramp TGA (10° C./min) under nitrogen cover.

Furthermore, the material of which stencil layer 38 is formed should have excellent dimensional stability, and should impart low stress on the package or wafer- or panel-level assembly during and after fabrication. Excellent dimensional stability is achieved by controlling how the film stencil is formed, for example, by extrusion or hot rolling, to minimize its intrinsic stress. Dimensional stability refers to the stencil's ability to resist buckling, warping, or flowing during the high-temperature processes encountered during fan-out fabrication. These processes include dielectric curing (2-5+ cycles at about 250°-260° C. for about 2-6 hours/cycle) and solder reflow or metal anneals at greater than about 200° C. This is a significant advantage over the prior art EMCs used in existing fan-out processes, which have a Tg of about 150° C. Above this temperature, the EMC materials soften and expand non-uniformly, resulting in out-of-plane deformation that is sometimes so severe that the wafer-level substrate cannot be handled in automated equipment. Advantageously, the present invention avoids these problems.

Suitable materials for forming stencil 38 include polymeric materials that range from amorphous to semi-crystalline in nature, and have high thermal stabilities and low coefficients of thermal expansion ("CTE"), similar to that of the dies that will be used. That is, typical CTE values of the chosen material will be less about 70 ppm/K, preferably less than about 40 ppm/K, and more preferably less than about 10 ppm/K, as determined by dynamic mechanical analysis (DMA) using ASTM E831, ASTM D696, or ISO 11359. In some embodiments, the CTE of the chosen material will be from about 40 to about 70 ppm/K. A low CTE minimizes warping and stress accumulation during thermal cycling such as may occur during the deposition and curing of polymer dielectrics to form the redistribution layers of the fan-out packages.

In a preferred embodiment, the polymeric material used to form the stencil 38 is a polymer other than an epoxy polymer. Examples of preferred polymeric materials include thermoplastic polymers selected from the group consisting of polycarbonates, polyetheretherketone, polyetherketone, polyethylene terephthalate, polyethylene naphthalate, polyimides, polyphenylene sulfide, polyphenylene oxide, polysulfone, polyethersulfones, and mixtures and/or copolymers of the foregoing.

In a preferred embodiment, the material used to form stencil 38 also includes one or more fillers. Preferred fillers could be particulate or fibrous and can also be organic (e.g., carbon black, carbon fibers, graphite) or inorganic (e.g., silica, metal oxides such as alumina, glass fibers), or even mixtures of any of the foregoing. Typical filler levels are from about 10% to about 80% by weight, and more preferably from about 30% to about 60% by weight filler, based upon the total weight of the polymer and the filler taken as 100% by weight.

In one embodiment, the stencil layer 38 is preferably formed of a material other than pure silicon. In a further embodiment, the stencil layer 38 is also formed of a material other than a silicon-containing compound such as silicon germanium, silicon dioxide, and silicon nitride. Additionally, although glass fibers may be present as a filler in the stencil layer 38, the stencil layer 38 preferably does not consist exclusively of glass, or glass without a polymeric material also being present.

Referring again to FIG. 2(c), the polymer film stencil layer 38 is applied to, and preferably in contact with, upper surface 36 of bonding layer 34. A preferred application method is lamination. Although stencil 38 is independently formed (i.e., in the form of a free-standing body) and then placed on the bonding layer 34 in the embodiment shown, it will be appreciated that stencil layer 38 could be applied by forming it "in place," on bonding layer 34, if desired, with the die openings created after polymer film application (e.g., by laser drilling). Regardless, as shown in the FIG. 2(c), in a preferred embodiment the first surface 42 of stencil layer 38 is placed in contact with upper surface 36 of bonding layer 34. Thus, there are areas of upper surface 36 that remain exposed (i.e., not covered by the stencil 38) and accessible through openings 46.

Figure 4:
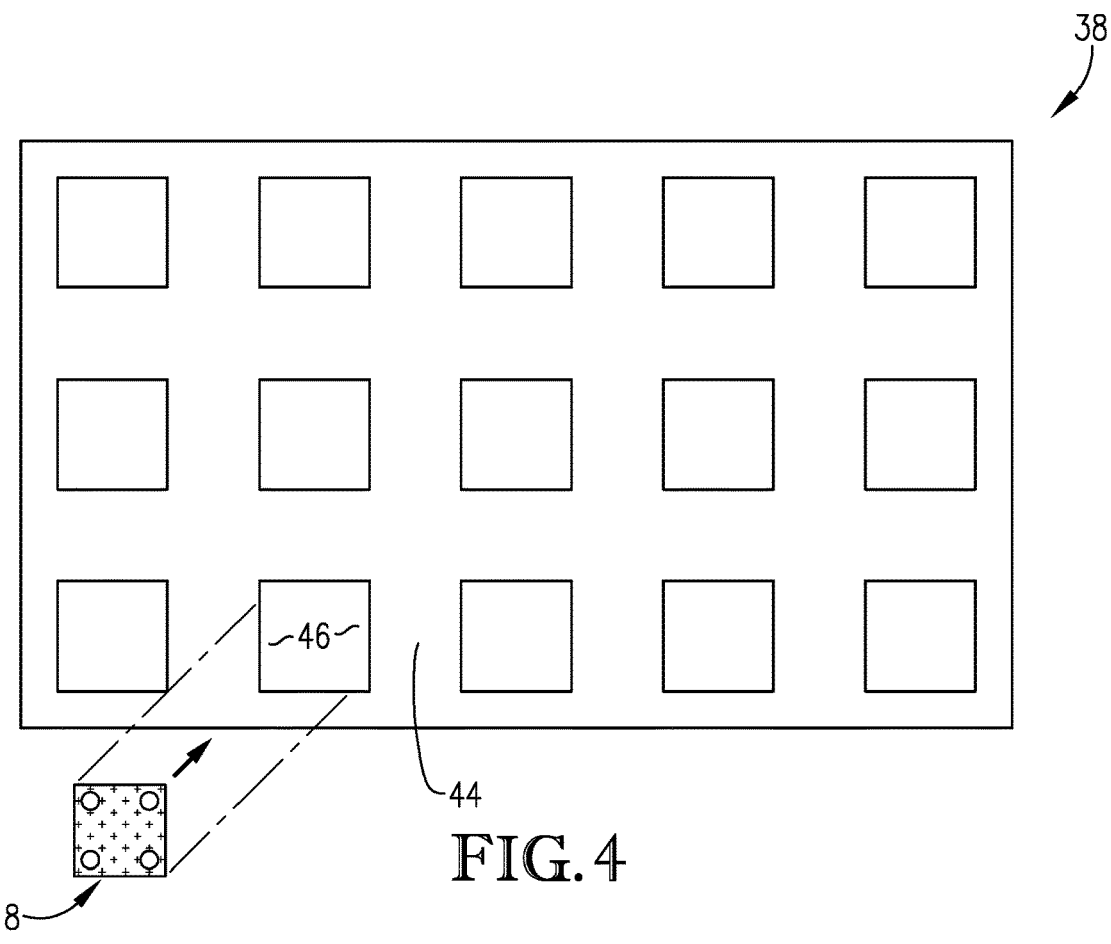
FIG. 4 is a drawing showing a plan view of the inventive stencil when first positioned on a carrier stack.

Referring to FIG. 2(d), a plurality of semiconductor dies 48 are placed within the openings 46 of stencil layer 38. Dies 48 have respective lower surfaces 50, respective upper surfaces 52, and respective sidewalls 54. The dies 48 are positioned within openings 46 so that their respective lower surfaces 50 are in contact with upper surface 36 of bonding layer 34. FIG. 4 shows a top view of the stencil 38 and also shows a die 18 that will be placed in an opening 46.

The bonding or adhesive layer 34 is then cured, using the curing conditions appropriate for the particular bonding or adhesive layer 34 being utilized. This is typically accomplished via heating or UV irradiation (through a transparent carrier 26). It will be appreciated that the cured bonding layer 34 should adhere to the release layer 30 sufficiently that the package assembly will not separate from the carrier 26 during processing, but also not adhere so strongly that the carrier 26 cannot be removed safely at the end of processing.

It is preferred that the openings 46 of stencil 38 are sized such that there will be small gaps 56 between each sidewall 54 of each die 48 and the nearest corresponding sidewall 47 of the opening 46 in which the particular die 48 has been positioned. (See FIG. 2(d).) This sizing allows for placement tolerances. The average size of the gaps around a particular die 48 (and preferably the average size of all gaps on the particular carrier 26) should be less than about 70 µm, preferably less than about 50 µm, and more preferably from about 10 µm to about 50 µm.

A curable gap-fill composition 58 is applied to fill the gaps 56, as shown in FIG. 2(e). While the gap-fill composition 58 can extend above the upper surfaces 52 of the dies 48, it should not impede further processing of the dies 48, including formation of the RDL. The composition 58 is preferably leveled and hardened (cured) in place by heating, UV irradiation, or other means, depending upon the requirements of the particular composition. Advantageously, the cured polymeric gap-fill composition 58 has a low modulus of elasticity, which allows for accommodation in movement as the stencil 38 and/or die 48 expand or contract in response to thermal cycling. The cured composition 58 also prevents the accumulation of moisture in the spaces between the stencil and the dies.

At this stage, the dies 48 that have been adhered to the temporary carrier 26 are referred to as "fan-out packages" 60. Further processing is then performed on fan-out packages 60. Examples of further processing include passivation, patterning, RDL formation, singulation, dicing of the fan-out packages, electroplating, plasma etching, cleaning, chemical vapor deposition, physical vapor deposition, and combinations of the foregoing. For example, FIG. 2(f) shows three dielectric layers 62, 64, 66 that have been formed, with a patterning and metallization step having been carried out before application of the subsequent dielectric layer to form metal connections 68 that "stair step" away from one another. Respective solder balls 70 are then attached to the upper most portion of each metal connection 68. Advantageously, the cured adhesive layer 34 and release layer 30 provide sufficient stability to the dies 48 during further processing, but also allow for release from the temporary carrier 26 at the appropriate time without damaging the processed fan-out packages 60.

The fan-out packages 60 are optionally further processed, such as singulating or bonding to another temporary carrier or adhesive tape. The fan-out packages 60 can then be debonded from the temporary carrier 26 by a number of means (FIG. 2(g)). One method of debonding would be to mechanically remove the fan-out packages 60 from the temporary carrier by lifting or peeling. Another method would be to decompose the release layer by using UV or laser. After debonding, any residual adhesive layer 34 or release layer 30 may optionally be removed by suitable cleaning processes.

Figure 1:
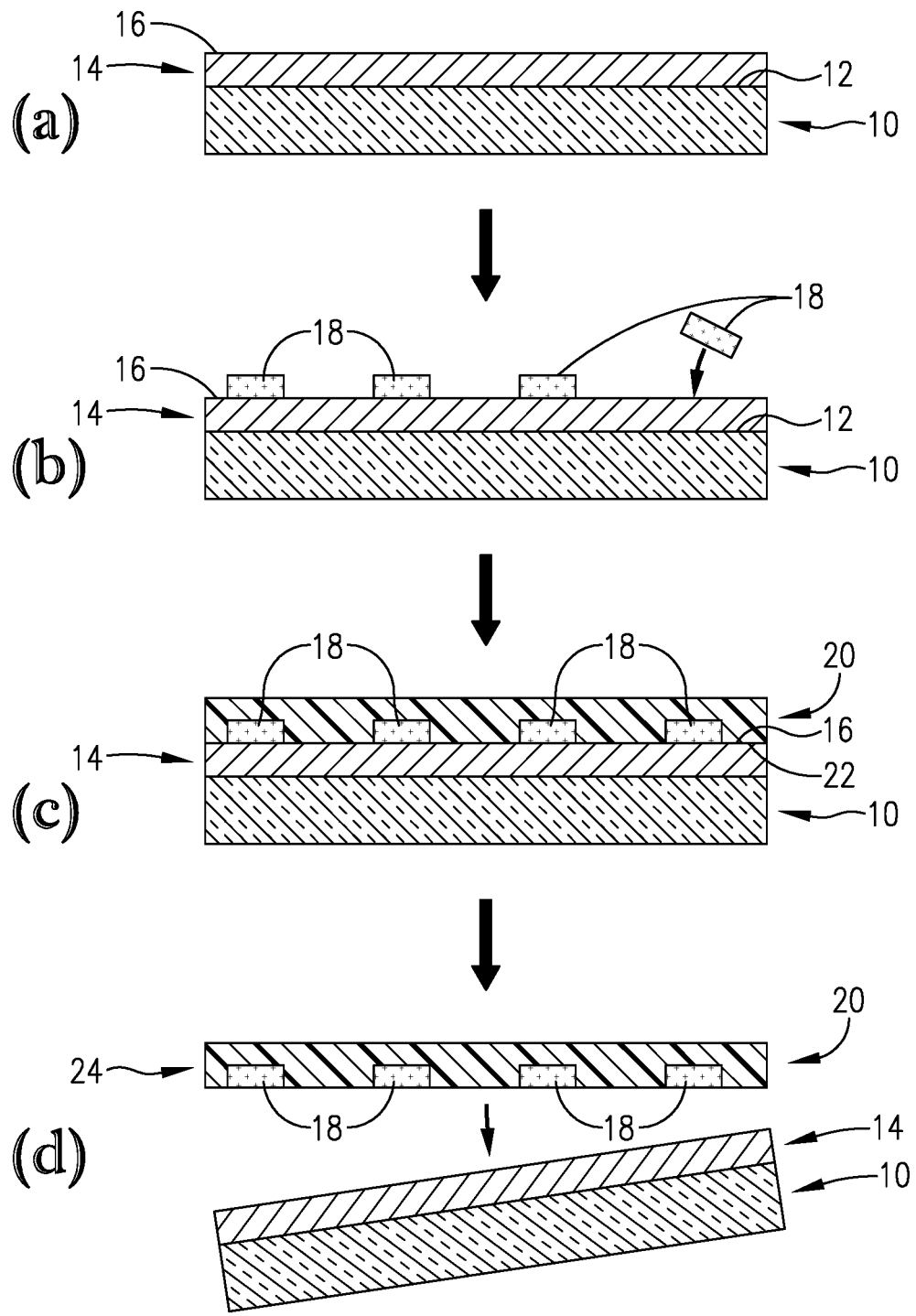
FIG. 1 is a cross-sectional view of a schematic drawing showing a prior art FOWLP process.

The above description related to FIG. 2 describes one preferred embodiment of the invention. In this embodiment, the dies 48 were positioned "face-up," and the further processing was carried out while the fan-out packages 60 were still bonded to the carrier 26. However, the dies 48 can also be positioned "face-down" and the debonding from carrier 26 could be carried out before further processing, as described with respect to the prior art in FIG. 1(d) (except on the fan-out packages 60 formed by the inventive stencil process). That is, the debonding step shown in FIG. 2(g) would be performed immediately after filling the gaps 56 around the "face-down" dies 48. After that debonding, the further processing steps shown in FIG. 2(f) would be carried out, but on the lower surfaces 50 of dies 48, since those lower surfaces would now be exposed due to separation of the package 60 from the adhesive layer 34 and carrier 60.

I claim:
1. A fan-out wafer level package process comprising:
   applying a stencil layer to a carrier stack, said stencil layer comprising sidewalls defining openings formed therein, wherein said carrier stack comprises:
      a carrier having an upper surface;
      optionally a release layer adjacent the upper surface of said carrier, said release layer having an upper surface remote from said carrier; and a bonding layer adjacent the upper surface of said release layer, if present, or adjacent the upper surface of said carrier if no release layer is present, said bonding layer having an upper surface remote from said carrier and said stencil layer being adjacent said bonding layer upper surface;

placing dies in said openings, said dies having respective lower surfaces adjacent said carrier stack and having respective upper surfaces remote from said carrier stack, wherein said placing comprises positioning said dies so that gaps exist between said dies and said sidewalls;

filling said gaps with a gap-fill composition so as to form a layer of fan-out packages; and forming a redistribution layer on said layer of fan-out packages.

2. The process of claim 1, wherein said applying comprises placing a stencil comprising a free-standing body on said carrier stack to form said stencil layer.

3. The process of claim 1, wherein said applying comprises forming a polymer layer and openings in the polymer layer to yield said stencil layer.

4. The process of claim 1, wherein said placing comprises placing said dies in contact with said upper surface of said bonding layer.

5. The process of claim 1, wherein said stencil layer comprises a polymeric material selected from the group consisting of polycarbonates, polyetheretherketone, polyetherketone, polyethylene terephthalate, polyethylene naphthalate, polyimides, polyphenylene sulfide, polyphenylene oxide, polysulfone, polyethersulfones, and mixtures and/or copolymers of the foregoing.

6. The process of claim 5, wherein said stencil layer further comprises a particulate or fibrous filler.

7. The process of claim 6, wherein said filler is selected from the group consisting of carbon black, carbon fibers, graphite, silica, metal oxides, glass fibers, and mixtures thereof.

8. The process of claim 1, further comprising carrying out processing steps at said upper surfaces of said dies.

9. The process of claim 8, wherein said processing steps are selected from the group consisting of passivation, patterning, singulation, electroplating, plasma etching, cleaning, chemical vapor deposition, physical vapor deposition, and combinations of the foregoing.

10. The process of claim 9, further comprising removing said carrier from said fan-out packages.

11. The process of claim 1, further comprising removing said carrier from said fan-out packages.

12. The process of claim 11, further comprising carrying out processing steps at said lower surfaces of said dies.

13. The process of claim 12, wherein said processing steps are selected from the group consisting of passivation, patterning, singulation, electroplating, plasma etching, cleaning, chemical vapor deposition, physical vapor deposition, and combinations of the foregoing.

14. The process of claim 1, wherein said stencil layer is formed from a material other than pure silicon.

15. A fan-out wafer level package formed from the process of claim 1.

16. The package of claim 15, wherein said stencil layer comprises a polymeric material selected from the group consisting of polycarbonates, polyetheretherketone, polyetherketone, polyethylene terephthalate, polyethylene naphthalate, polyimides, polyphenylene sulfide, polyphenylene oxide, polysulfone, polyethersulfones, and mixtures and/or copolymers of the foregoing.

17. The package of claim 16, wherein said stencil layer further comprises a particulate or fibrous filler.

18. The package of claim 17, wherein said filler is selected from the group consisting of carbon black, carbon fibers, graphite, silica, metal oxides, glass fibers, and mixtures thereof.

19. The package of claim 15, wherein said stencil layer comprises sidewalls defining each opening, and said dies are positioned in said respective openings so that gaps exist between said dies and said sidewalls.

20. The package of claim 19, further comprising a gap-fill composition in said gaps.

21. The package of claim 15, wherein said dies have respective upper surfaces remote from said carrier, further comprising a redistribution layer adjacent at least some of said die upper surfaces.

22. The package of claim 15, said stencil layer being formed from a material other than pure silicon.

23. The process of claim 1, wherein said filling said gaps with a gap-fill composition does not impede further processing of said dies.

* * * * *